United States Patent

Ichimura

(10) Patent No.: US 10,249,813 B2
(45) Date of Patent: Apr. 2, 2019

(54) METHOD OF MANUFACTURING PIEZOELECTRIC VIBRATOR ELEMENT

(71) Applicant: SII Crystal Technology Inc., Chiba-shi, Chiba (JP)

(72) Inventor: Naoya Ichimura, Chiba (JP)

(73) Assignee: SII CRYSTAL TECHNOLOGY INC., Chiba (JP)

( * ) Notice: Subject to any disclaimer, the term of this patent is extended or adjusted under 35 U.S.C. 154(b) by 168 days.

(21) Appl. No.: 15/341,587

(22) Filed: Nov. 2, 2016

(65) Prior Publication Data

US 2017/0125661 A1 May 4, 2017

(30) Foreign Application Priority Data

Nov. 4, 2015 (JP) .................. 2015-216936

(51) Int. Cl.
| | |
|---|---|
| *H04R 17/00* | (2006.01) |
| *H01L 41/27* | (2013.01) |
| *H01L 41/293* | (2013.01) |
| *H01L 41/297* | (2013.01) |
| *H03H 3/02* | (2006.01) |
| *H03H 9/10* | (2006.01) |
| *H03H 9/21* | (2006.01) |
| *H01L 41/332* | (2013.01) |

(52) U.S. Cl.
CPC ............ *H01L 41/27* (2013.01); *H01L 41/293* (2013.01); *H01L 41/297* (2013.01); *H03H 3/02* (2013.01); *H03H 9/1014* (2013.01); *H03H 9/21* (2013.01); *H01L 41/332* (2013.01); *H03H 2003/026* (2013.01)

(58) Field of Classification Search
CPC .......... H03H 3/02; H03H 9/1014; H03H 9/21; H01L 41/27; H01L 41/293; H01L 41/297; H01L 41/332
See application file for complete search history.

(56) References Cited

U.S. PATENT DOCUMENTS

| | | | | |
|---|---|---|---|---|
| 7,872,404 B2* | 1/2011 | Numata | .................. | H03B 5/30 310/348 |
| 8,176,606 B2* | 5/2012 | Kobayashi | ............... | H03H 3/02 29/25.35 |
| 8,987,979 B2* | 3/2015 | Tamura | .............. | H03H 9/02157 310/344 |

FOREIGN PATENT DOCUMENTS

JP          2009-194630          8/2009

\* cited by examiner

*Primary Examiner* — Paul D Kim
(74) *Attorney, Agent, or Firm* — Brinks Gilson & Lione

(57) ABSTRACT

There is provided a method of manufacturing a piezoelectric vibrator element capable of preventing the piezoelectric vibrator element from being damaged when segmentallizing the piezoelectric vibrator element. The method of manufacturing a piezoelectric vibrator element includes the steps of providing the wafer with the piezoelectric plate and a frame part adapted to support the piezoelectric plate via a connection part, providing a pair of excitation electrodes to the piezoelectric plate, and forming a pair of extending electrodes extending from the piezoelectric plate to the frame part through the connection part and electrically connected respectively to the pair of excitation electrodes, and segmentallizing the piezoelectric plate by cutting the connection part. In the step of providing the pair of excitation electrodes, the pair of extending electrodes are formed on a side surface of the connection part.

3 Claims, 10 Drawing Sheets

METHOD OF MANUFACTURING PIEZOELECTRIC VIBRATOR ELEMENT

RELATED APPLICATIONS

This application claims priority under 35 U.S.C. § 119 to Japanese Patent Application No. 2015-216936 filed on Nov. 4, 2015, the entire content of which is hereby incorporated by reference.

BACKGROUND OF THE INVENTION

1. Field of the Invention

The present invention relates to a method of manufacturing a piezoelectric vibrator element.

2. Description of the Related Art

For example, in the electronic apparatus such as a cellular phone or a portable information terminal, there is used a piezoelectric vibrator using a quartz crystal or the like as a device used for a clock time source, a timing source for a control signal and so on, a reference signal source, and so on. As a piezoelectric vibrator of this kind, there has been known a device having a piezoelectric vibrator element hermetically encapsulated in a package provided with a cavity. In recent years, a demand for miniaturization of the piezoelectric vibrator and the piezoelectric vibrator element is more and more increasing due to the miniaturization of the electronic device.

As described in, for example, JP-A-2009-194630 (Document 1), a plurality of piezoelectric vibrator elements are manufactured in a lump using a wafer made of a piezoelectric material. On this occasion, the piezoelectric vibrator elements are formed in the state of being connected to a frame part for supporting a piezoelectric plate via connection parts. On one principal surface of the wafer, a pair of extending electrodes extending from the piezoelectric plate to the frame part passing through the connection parts are formed so as to correspond to the respective piezoelectric vibrator elements. The frequency of each of the piezoelectric vibrator elements is measured by, for example, pressing a probe or the like against the extending electrode on the frame part. Subsequently, the piezoelectric vibrator elements are cut in the connection parts to be segmentallized.

Incidentally, in the piezoelectric vibrator element, the strength of each part of the piezoelectric vibrator element decreases in some cases due to the miniaturization of the piezoelectric vibrator element. Therefore, there is a possibility that the piezoelectric vibrator element is damaged due to the stress acting via the connection part when segmentallizing the piezoelectric vibrator element. Therefore, it is desirable for the connection part to be formed smaller in width so as to be able to be cut easily.

However, in the related art, since the pair of extending electrodes are formed on the one principal surface of the connection part so as to be arranged side by side, there is a limitation to narrow the width of the connection part while preventing the short circuit between the pair of extending electrodes on the grounds of the accuracy of patterning of the extending electrodes. Therefore, in the method of manufacturing the piezoelectric vibrator element in the related art, there is a problem regarding the point of preventing the piezoelectric vibrator element from being damaged when segmentallizing the piezoelectric vibrator element while miniaturizing the piezoelectric vibrator element.

SUMMARY OF THE INVENTION

Therefore, the invention is to provide a method of manufacturing a piezoelectric vibrator element capable of preventing the piezoelectric vibrator element from being damaged when segmentallizing the piezoelectric vibrator element.

A method of manufacturing a piezoelectric vibrator element according to the invention is a method of manufacturing a piezoelectric vibrator element using a wafer made of a piezoelectric, the piezoelectric vibrator element including a piezoelectric plate, and a pair of excitation electrodes formed on the piezoelectric plate and adapted to vibrate the piezoelectric plate when a predetermined drive voltage is applied, the method including the steps of providing the wafer with the piezoelectric plate and a frame part adapted to support the piezoelectric plate via a connection part, providing a pair of excitation electrodes to the piezoelectric plate by patterning an electrode film on a principal surface and a side surface of the wafer, and forming a pair of extending electrodes extending from the piezoelectric plate to the frame part through the connection part to electrically be connected respectively to the pair of excitation electrodes, and segmentallizing the piezoelectric plate by cutting the connection part, wherein in the step of providing the pair of excitation electrodes, at least either one of the pair of extending electrodes is formed on the side surface of the connection part.

According to the invention, since at least one of the extending electrodes is formed on the side surface of the connection part, it is possible to prevent the pair of extending electrodes from being formed at positions adjacent to each other on the principal surface of the connection part. Thus, it is possible to form the connection part with narrower width compared to the related art of forming the pair of extending electrodes on one principal surface of the connection part while preventing the pair of extending electrodes from shorting. Therefore, it becomes possible to easily cut the connection parts, and it is possible to prevent the piezoelectric vibrator element from being damaged when segmentallizing the piezoelectric vibrator element.

In the method of manufacturing a piezoelectric vibrator element described above, it is preferable that in the step of providing the wafer, an irregularly-shaped part having a surface tilted with respect to a principal surface of the wafer is formed on the side surface of the connection part, and in the step of providing the pair of excitation electrodes, at least either one of the pair of extending electrodes is formed on the irregularly-shaped part.

If the wet-etching process is performed on the piezoelectric material such as quartz crystal in the step of providing the wafer, an irregularly-shaped part formed of the natural crystal surface of the piezoelectric material is formed, for example, on the corners of the boundary part between the connection part and the piezoelectric plate as the etching residue in some cases. According to the invention, since the extending electrode is formed on the irregularly-shaped part in the side surface of the connection part, it is possible to prevent the pair of extending electrodes from being formed at positions adjacent to each other on the principal surface of the connection part. Therefore, it is possible to form the connection part with narrower width compared to the related art while preventing the pair of extending electrodes from shorting. Therefore, it becomes possible to easily cut the connection parts, and it is possible to prevent the piezoelectric vibrator element from being damaged when segmentallizing the piezoelectric vibrator element.

In the method of manufacturing a piezoelectric vibrator element described above, it is preferable that in the step of providing the wafer, the connection part is formed so that a width of the connection part decreases in a direction from the frame part toward the piezoelectric plate, and in the step of providing the pair of excitation electrodes, at least either one of the pair of extending electrodes is formed on a side surface of a narrow part having a smallest width of the connection part.

According to the invention, since the extending electrode is formed on the side surface of the narrow part having the smallest width of the connection part, the pair of extending electrodes can more surely be prevented from being formed at the positions adjacent to each other. Therefore, it is possible to form the connection part with narrower width compared to the related art while preventing the pair of extending electrodes from shorting. Therefore, it becomes possible to more easily cut the connection parts, and it is possible to prevent the piezoelectric vibrator element from being damaged when segmentallizing the piezoelectric vibrator element.

According to the invention, since at least one of the extending electrodes is formed on the side surface of the connection part, it is possible to prevent the pair of extending electrodes from being formed at positions adjacent to each other on the principal surface of the connection part. Thus, it is possible to form the connection part with narrower width compared to the related art of forming the pair of extending electrodes on one principal surface of the connection part while preventing the pair of extending electrodes from shorting. Therefore, it becomes possible to easily cut the connection parts, and it is possible to prevent the piezoelectric vibrator element from being damaged when segmentallizing the piezoelectric vibrator element.

DETAILED DESCRIPTION OF THE PREFERRED EMBODIMENTS

An embodiment of the invention will hereinafter be described with reference to the drawings.
(Piezoelectric Vibrator)

Figure 1:
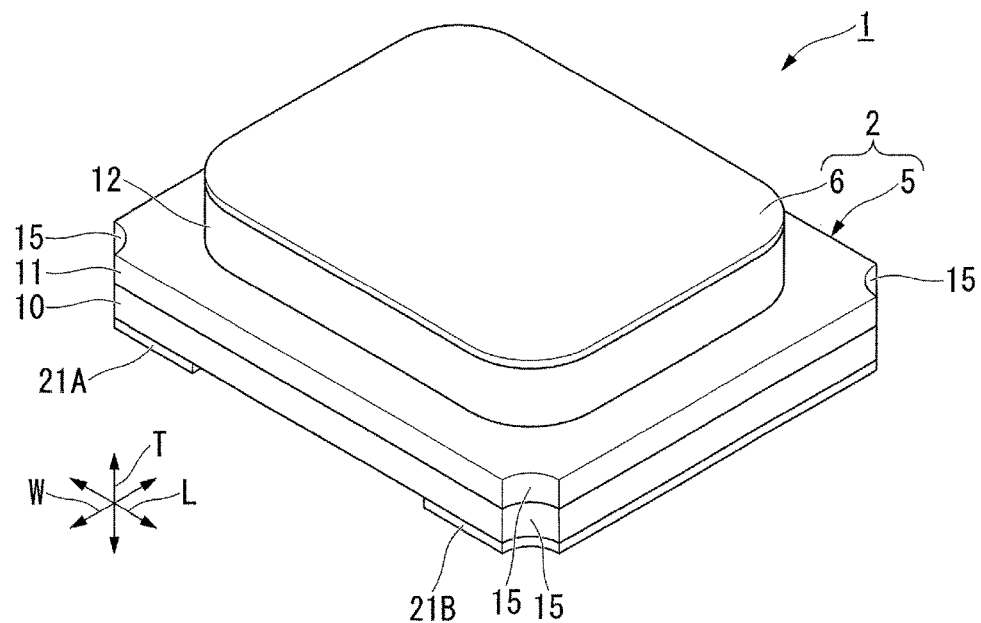
FIG. 1 is an exterior perspective view of a piezoelectric vibrator according to an embodiment of the invention.
Figure 2:
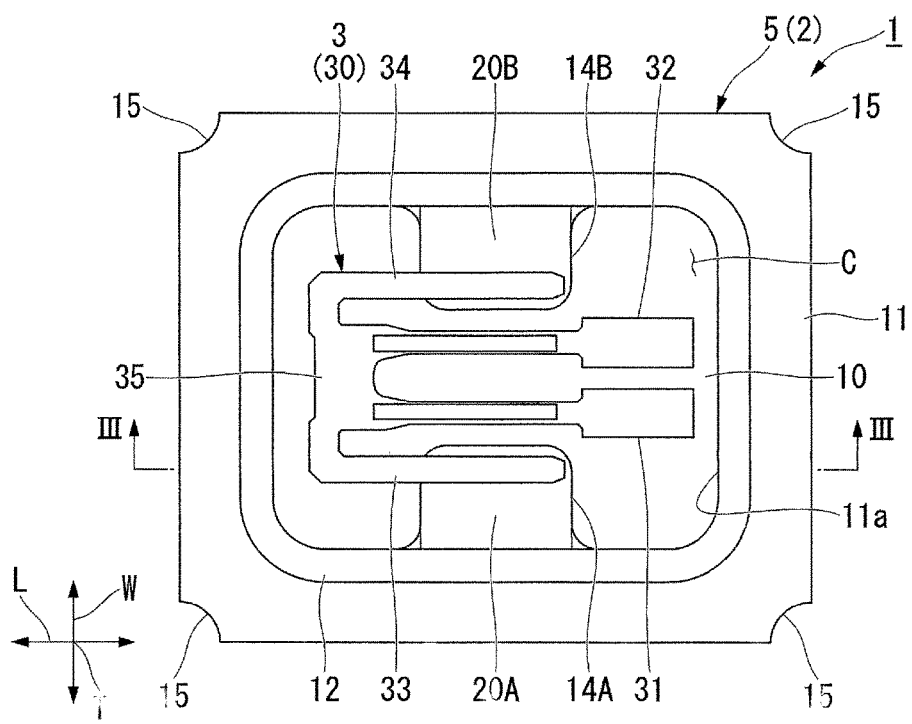
FIG. 2 is an internal configuration diagram of the piezoelectric vibrator according to the embodiment.
Figure 3:
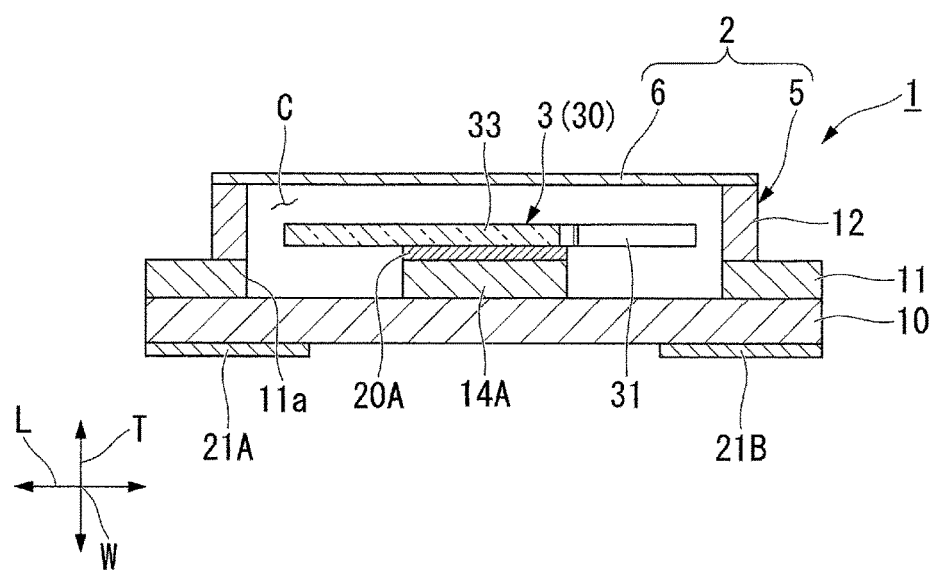
FIG. 3 is a cross-sectional view along the line shown in FIG. 2.
Figure 4:
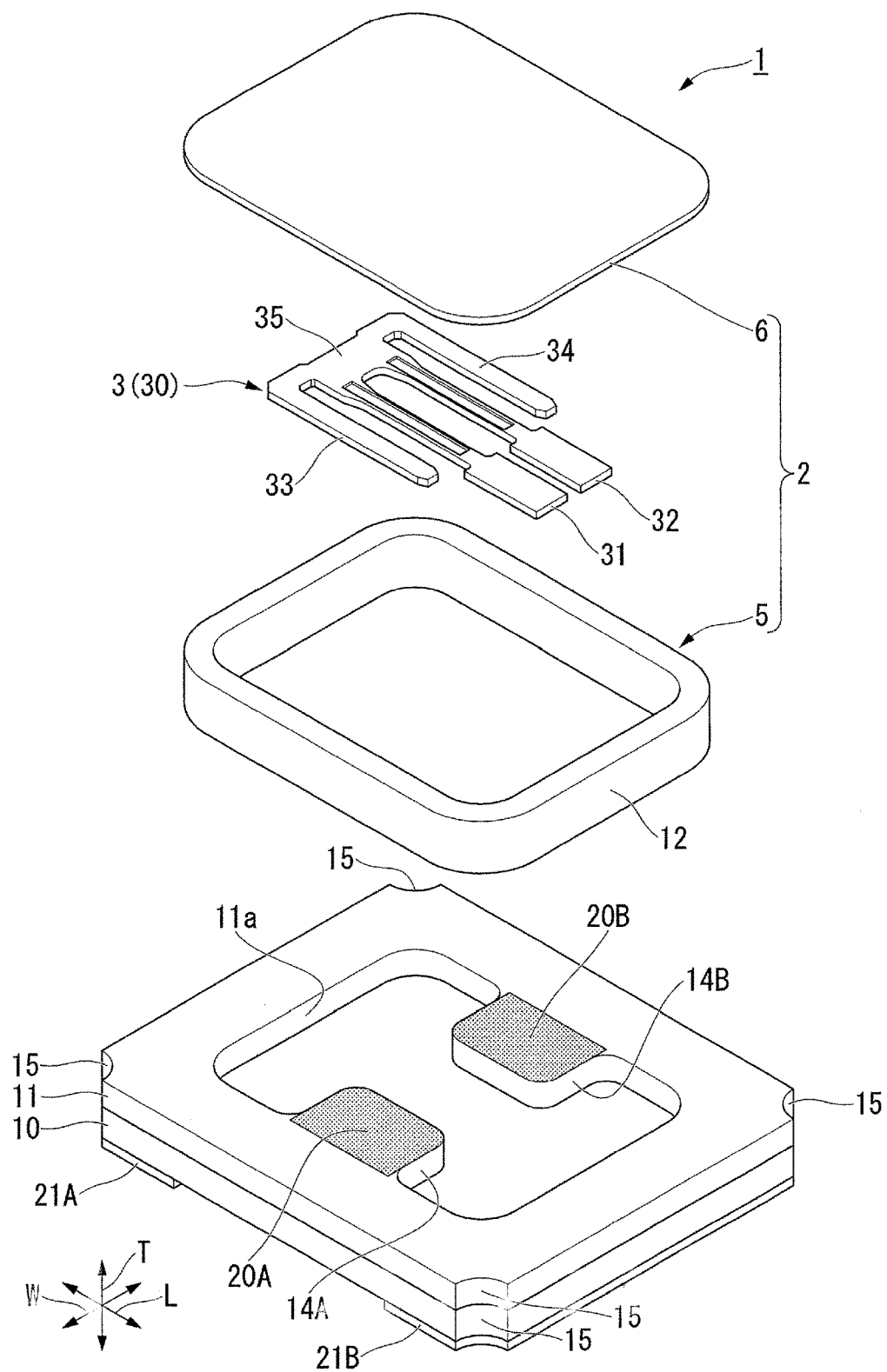
FIG. 4 is an exploded perspective view of the piezoelectric vibrator according to the embodiment.

FIG. 1 is an exterior perspective view of a piezoelectric vibrator according to the embodiment. FIG. 2 is an internal configuration diagram of the piezoelectric vibrator according to the embodiment. FIG. 3 is a cross-sectional view along the line III-III shown in FIG. 2. FIG. 4 is an exploded perspective view of the piezoelectric vibrator according to the embodiment.

As shown in FIG. 1 through FIG. 4, a piezoelectric vibrator 1 according to the present embodiment is formed as a surface-mounted vibrator of a ceramic package type provided with a package 2 incorporating a cavity C sealed airtightly, and a piezoelectric vibrator element 3 housed in the cavity C.

It should be noted that the piezoelectric vibrator 1 is formed to have a rectangular solid shape in a planar view. In the present embodiment, in the planar view, the longitudinal direction of the piezoelectric vibrator 1 is referred to as a longitudinal direction L, the direction along the shorter dimension is referred to as a width direction W, and the direction perpendicular to the longitudinal direction L and the width direction W is referred to as a thickness direction T.

As shown in FIG. 3, the package 2 is provided with a package main body 5, and a sealing plate 6, which is bonded to the package main body 5, and at the same time forms the cavity C between the sealing plate 6 and the package main body 5.

The package main body 5 is provided with a first base substrate 10 and a second base substrate 11 bonded to each other in the state of being overlapped with each other, and a sealing ring 12 bonded on the second base substrate 11.

As shown in FIG. 4, on the four corners of each of the first base substrates 10 and the second base substrate 11, cutout parts 15 each having a quarter-arc shape in a planar view are respectively formed throughout the entire substrate in the thickness direction of the both base substrates 10, 11. The first base substrate 10 and the second base substrate 11 are manufactured by bonding two ceramic substrates in, for example, a wafer state so as to overlap each other, then forming a plurality of through holes, which penetrate both of the ceramic substrates and are arranged in a matrix, and subsequently cutting both of the ceramic substrates in a grid manner with reference to the through holes. On this occasion, the cutout parts 15 are formed by dividing the through hole into four parts.

It should be noted that although it is assumed that the first base substrate 10 and the second base substrate 11 are made of ceramics, as the specific ceramic material, there can be cited, for example, HTCC (High Temperature Co-Fired Ceramic) made of alumina, and LTCC (Low Temperature Co-Fired Ceramic) made of glass ceramics.

As shown in FIG. 3, the upper surface of the first base substrate 10 corresponds to the bottom surface of the cavity C.

The second base substrate 11 is made to overlap the first base substrate 10, and is bonded to the first base substrate 10 by sintering or the like. In other words, the second base substrate 11 is integrated with the first base substrate 10.

As shown in FIG. 4, the second base substrate 11 is provided with a penetrating part 11a. The penetrating part 11a is formed to have a rectangular planar shape with the four corners rounded. The inner side surface of the penetrating part 11a forms a part of the sidewall of the cavity C (see FIG. 3). On both sides in the width direction W of the penetrating part 11a, the inner side surface is provided with mounting parts 14A, 14B protruding inward. The mounting parts 14A, 14B are formed in roughly the center in the longitudinal direction L of the penetrating part 11a.

The sealing ring 12 is a conductive frame-like member one size smaller than the outer shape of each of the first base substrates 10 and the second base substrate 11, and is bonded to the upper surface of the second base substrate 11. Specifically, the sealing ring 12 is bonded on the second base substrate 11 by baking with a brazing material such as silver solder, a soldering material, or the like, or bonded by fusion bonding to a metal bonding layer formed (by, e.g., evaporation or sputtering besides electrolytic plating or electroless plating) on the second base substrate 11.

As the material of the sealing ring 12, there can be cited, for example, a nickel base alloy, and specifically, it is sufficient to be selected from kovar, elinvar, invar, 42-alloy, and so on. In particular, as the material of the sealing ring 12, it is preferable to select a material closer in thermal expansion coefficient to the first base substrates 10 and the second base substrate 11 made of ceramics. For example, in the case of using alumina having the thermal expansion coefficient of $6.8 \times 10^{-6}/°$ C. as the first base substrate 10 and the second base substrate 11, kovar having the thermal expansion coefficient of $5.2 \times 10^{6}/°$ C. or 42-alloy having the thermal expansion coefficient of 4.5 through $6.5 \times 10^{-6}/°$ C. is preferably used as the sealing ring 12.

As shown in FIG. 3, the sealing plate 6 is an electrically-conductive substrate made to overlap the sealing ring 12, and is airtightly bonded to the package main body 5 by bonding to the seal ring 12. The space defined by the sealing plate 6, the sealing ring 12, the penetrating part 11a of the second base substrate 11, and the upper surface of the first base substrate 10 functions as the cavity C airtightly sealed.

As a welding method of the sealing plate 6, there can be cited, for example, seam welding by making a roller electrode have contact, laser welding, and ultrasonic welding. Further, in order to make the welding between the sealing plate 6 and the sealing ring 12 more reliable, it is preferable to form a bonding layer of nickel, gold, or the like having an affinity with each other at least on the lower surface of the sealing plate 6 and the upper surface of the sealing ring 12.

As shown in FIG. 4, on the upper surfaces of the mounting parts 14A, 14B of the second base substrate 11, there are formed a pair of electrode pads 20A, 20B, respectively, which are connection electrodes with the piezoelectric vibrator element 3. Further, on the lower surface of the first base substrate 10, a pair of external electrodes 21A, 21B are formed in the longitudinal direction L with a space. The electrode pads 20A, 20B and the external electrodes 21A, 21B are each a single layer film made of single metal or a laminated film having different metals stacked one another formed by, for example, vapor deposition or sputtering, and are electrically connected to each other via interconnections not shown, respectively.

(Piezoelectric Vibrator Element)

Figure 5:
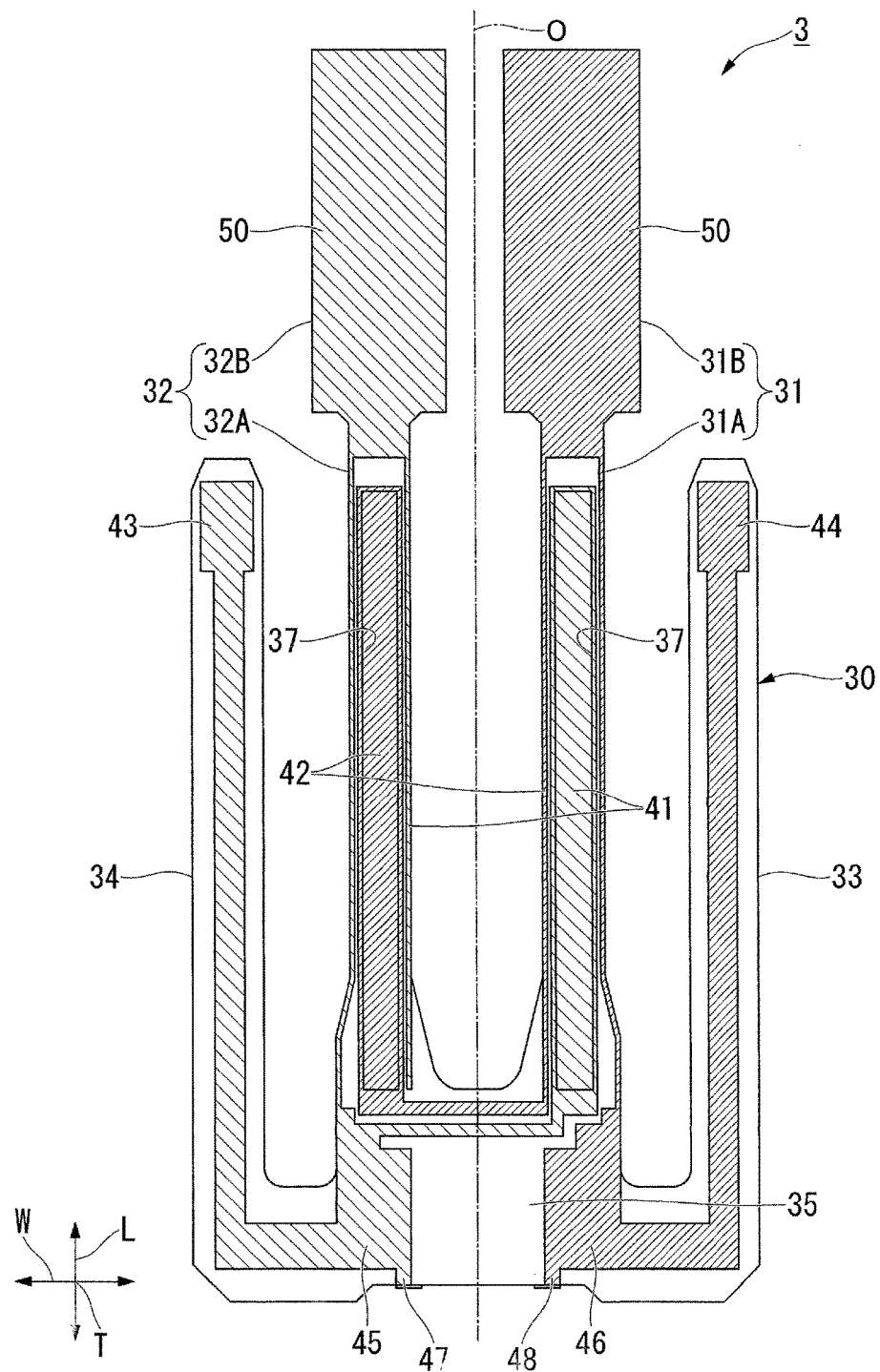
FIG. 5 is a plan view of a piezoelectric vibrator element according to the embodiment.

FIG. 5 is a plan view of a piezoelectric vibrator element according to the embodiment.

As shown in FIG. 5, the piezoelectric vibrator element 3 is mainly provided with a piezoelectric plate 30, and electrodes 41 through 48 formed on the piezoelectric plate 30. It should be noted that the longitudinal direction L, the width direction W, and the thickness direction T of the piezoelectric vibrator 1 coincide with the longitudinal direction, the width direction, and the thickness direction of the piezoelectric vibrator element 3, respectively. Therefore, in the following description, the longitudinal direction, the width direction, and the thickness direction of the piezoelectric vibrator element 3 are respectively denoted by the same symbols as the longitudinal direction L, the width direction W, and the thickness direction T of the piezoelectric vibrator 1.

The piezoelectric plate 30 is formed of a piezoelectric material such as a quartz crystal, a lithium tantalate, or a lithium niobate. The piezoelectric plate 30 is provided with a pair of vibrating arm parts (a first vibrating arm part 31 and a second vibrating arm part 32), a base part 35, and a pair of support arm parts (a first support arm part 33 and a second support arm part 34). The piezoelectric plate 30 is formed so that the planar shape viewed from the thickness direction T is roughly symmetrical about the central axis O along the longitudinal direction L. It should be noted that in the description of the present embodiment, quartz crystal is cited as an example of the piezoelectric material used for forming the piezoelectric plate 30.

The vibrating arm parts 31, 32 extend in the longitudinal direction L, and are arranged side by side in the width direction W in parallel to each other. The vibrating arm parts 31, 32 each vibrate with the base end part functioning as a fixed end, and the tip part functioning as a free end. The vibrating arm parts 31, 32 have main body parts 31A, 32A located in the base end, and weight parts 31B, 32B located in the tip, respectively.

The main body parts 31A, 32A of the vibrating arm parts 31, 32 extend from the base end parts of the vibrating arm parts 31, 32 along the longitudinal direction L, respectively. The main body parts 31A, 32A are each provided with a groove part 37. The groove parts 37 are recessed in the thickness direction T, and at the same time extend along the longitudinal direction L on the both principal surfaces of the main body parts 31A, 32A. The groove parts 37 are formed continuously from the base end parts of the vibrating arm parts 31, 32 to the tips of the main body parts 31A, 32A, respectively.

On the outer surfaces of the main body parts 31A, 32A of the respective vibrating arm parts 31, 32, there are disposed two systems of excitation electrodes (the first excitation electrode 41 and the second excitation electrode 42). The excitation electrodes 41, 42 vibrate the respective vibrating arm parts 31, 32 in the width direction W when a predetermined drive voltage is applied. The excitation electrodes 41, 42 are patterned in an electrically isolated state.

Specifically, the first excitation electrode 41 is mainly formed on the groove part 37 of the first vibrating arm part 31, and on the both side surfaces of the second vibrating arm part 32. Further, the second excitation electrode 42 is mainly formed on the both side surfaces of the first vibrating arm part 31, and on the groove part 37 of the second vibrating arm part 32.

The weight parts 31B, 32B of the vibrating arm parts 31, 32 extend from the tips of the main body parts 31A, 32A along the longitudinal direction L, respectively. The weight parts 31B, 32B each have a rectangular planar shape, and are arranged to be wider in width in the width direction W than the main body parts 31A, 32A, respectively. Thus, since it is possible to increase the mass of the tip of each of the vibrating arm parts 31, 32, and the inertial moment when vibrating, it is possible to shorten the vibrating arm parts 31, 32 compared to a piezoelectric vibrator element not provided with the weight parts 31B, 32B.

On the principal surface of each of the weight parts 31B, 32B, there is formed a weight metal film 50. The weight metal film 50 is disposed for increasing the mass in the tip of each of the vibrating arm parts 31, 32, and suppressing rise in resonant frequency when shortening each of the vibrating arm parts 31, 32. In the present embodiment, the weight metal film 50 is formed integrally with the first excitation electrode 41 or the second excitation electrode 42.

The base part 35 connects the base end parts of the respective vibrating arm parts 31, 32 integrally with each other.

The support arm parts 33, 34 are each formed to have an L shape in a planar view, and surround the base part 35 and the vibrating arm parts 31, 32 (the main body parts 31A, 32A) from the outer sides in the width direction W. Specifically, the support arm parts 33, 34 protrude from the both side surfaces in the width direction W in the base part 35 outward in the width direction W, and then extend along the longitudinal direction L in parallel to the vibrating arm parts 31, 32, respectively.

On the principal surfaces of the respective support arm parts 33, 34, there are respectively disposed the mounting electrodes (the first mounting electrode 43 and the second mounting electrode 44) as the mounting parts when mounting the piezoelectric vibrator element 3 to the package 2. Specifically, the first mounting electrode 43 is disposed in the vicinity of the tip of the second support arm part 34, and the second mounting electrode 44 is disposed in the vicinity of the first support arm part 33.

The two systems of excitation electrodes 41, 42 and the two systems of mounting electrodes 43, 44 are respectively connected electrically to each other with two systems of wiring electrodes (the first wiring electrode 45 and the second wiring electrode 46). The first wiring electrode 45 is formed on a path from the second support arm part 34 to the vibrating arm parts 31, 32 via the base part 35. The second wiring electrode 46 is formed on a path from the first support arm part 33 to the vibrating arm parts 31, 32 via the base part 35.

The excitation electrodes 41, 42, the mounting electrodes 43, 44, and the wiring electrodes 45, 46 are formed on the both principal surfaces of the piezoelectric plate 30 so that the respective planar shapes viewed from, for example, the thickness direction T coincide with each other.

On the principal surface of the base part 35, there are disposed a pair of extending electrodes (the first extending electrode 47 and the second extending electrode 48). The extending electrodes 47, 48 are electrically connected to the excitation electrodes 41, 42, respectively. Specifically, the first extending electrode 47 extends from the first wiring electrode 45 toward the edge on the opposite side to the connection parts to the respective vibrating arm parts 31, 32 in the base part 35 on one principal surface of the base part 35, and then extends on a side surface of the base part 35. The second extending electrode 48 extends from the second wiring electrode 46 toward the edge on the opposite side to the connection parts to the respective vibrating arm parts 31, 32 in the base part 35 on the one principal surface of the base part 35, and then extends on the side surface of the base part 35. The first extending electrode 47 and the second extending electrode 48 are in the state of being electrically isolated from each other.

As shown in FIG. 2 and FIG. 3, the piezoelectric vibrator element 3 configured as described above is housed in the cavity C of the package 2 airtightly sealed. In the piezoelectric vibrator element 3, the support arm parts 33, 34 are electrically and mechanically bonded to the two electrode pads 20A, 20B provided to the mounting parts 14A, 14B, respectively, via electrically-conductive adhesives. Thus, each of the vibrating arm parts 31, 32 of the piezoelectric vibrator element 3 is cantilevered via the base part 35, and at the same time, the first mounting electrode 43 is electrically connected to the electrode pad 20B, and the second mounting electrode 44 is electrically connected to the electrode pad 20A (see FIG. 5).

It should be noted that it is also possible to use a metal bump instead of the electrically-conductive adhesive as the electrically-conductive bonding members for bonding the support arm parts 33, 34 respectively to the electrode pads 20A, 20B. What the electrically-conductive adhesive and the metal bump have in common is that these are the electrically-conductive bonding members having a property of having fluidity in the initial stage of the bonding process, and becoming solidified to develop bonding strength in the late stage of the bonding process.

When a predetermined voltage is applied to the external electrodes 21A, 21B, a current flows through the excitation electrodes 41, 42 shown in FIG. 5 to generate an electrical field between the excitation electrodes 41, 42. The vibrating arm parts 31, 32 vibrate at a predetermined resonant frequency in directions (along the width direction W) of, for example, getting closer to and away from each other due to the inverse piezoelectric effect by the electrical field generated between the excitation electrodes 41, 42. The vibration of the vibrating arm parts 31, 32 is used as the time source, the timing source of a control signal, the reference signal source, and so on.

(Method of Manufacturing Piezoelectric Vibrator Element)

Then, a method of manufacturing the piezoelectric vibrator element 3 according to the present embodiment will be described. It should be noted that FIG. 5 should be referred to for the reference symbols of the respective constituents in the following description.

Figure 6:
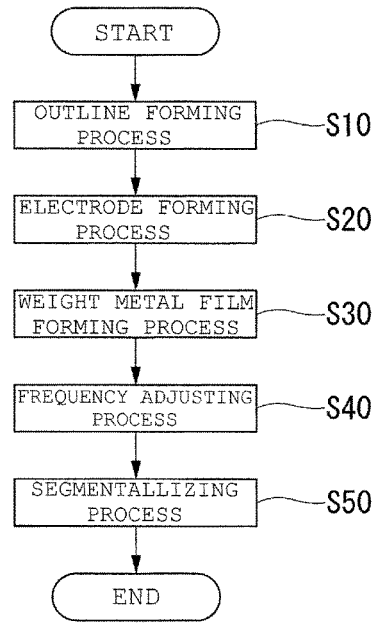
FIG. 6 is a flowchart showing a method of manufacturing the piezoelectric vibrator element according to the embodiment.
Figure 7:
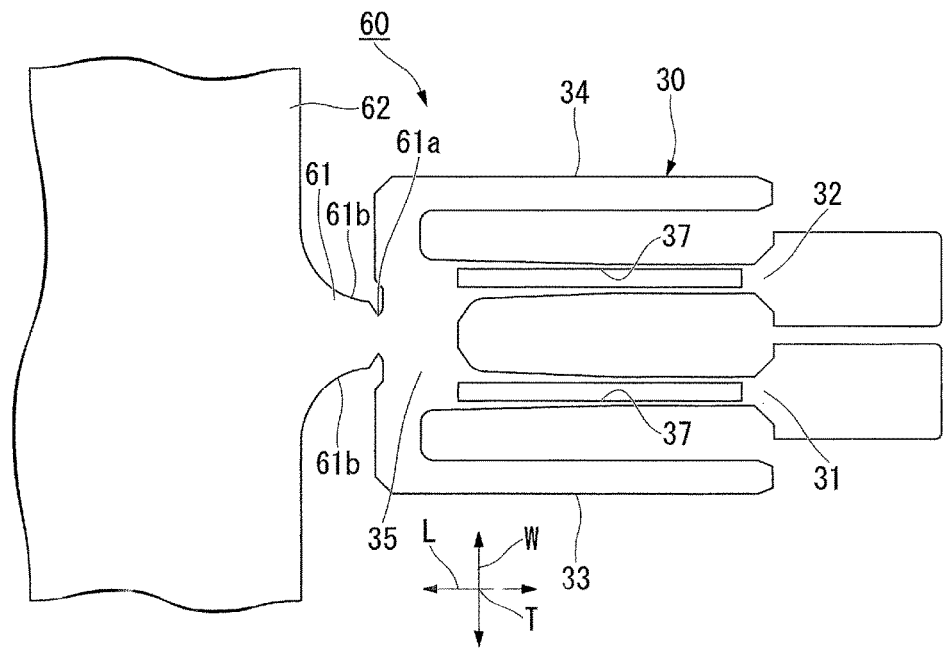
FIG. 7 is a process chart for explaining the method of manufacturing the piezoelectric vibrator element according to the embodiment, and is a partial plan view of a wafer.
Figure 8:
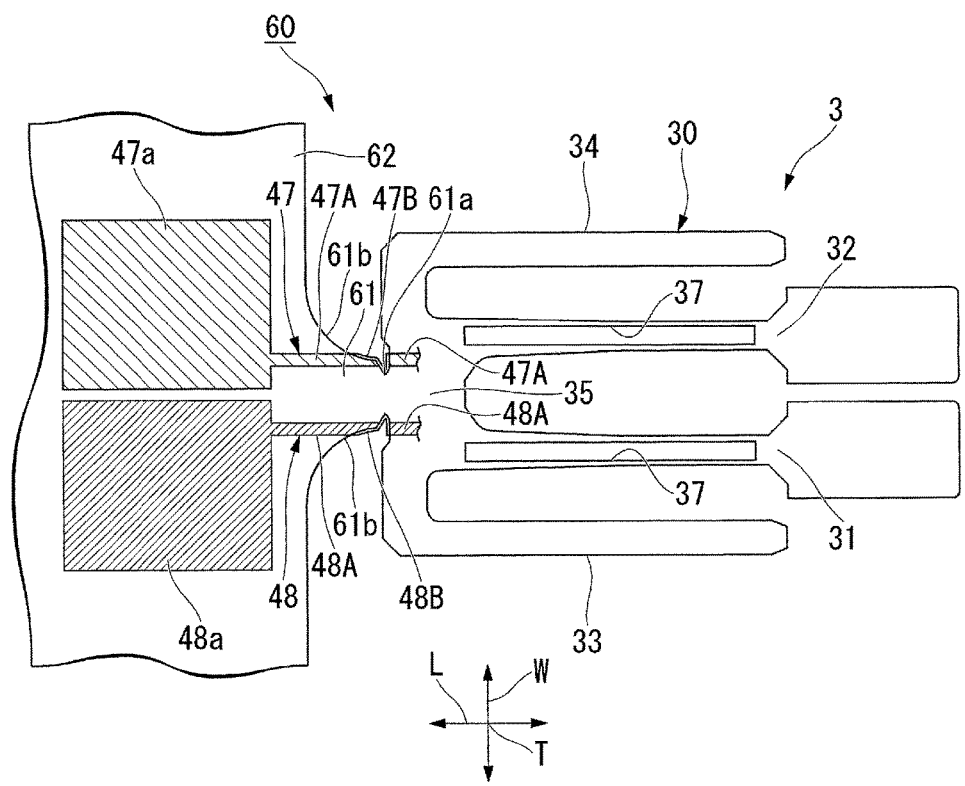
FIG. 8 is a process chart for explaining the method of manufacturing the piezoelectric vibrator element according to the embodiment, and is a partial plan view of the wafer.
Figure 9:
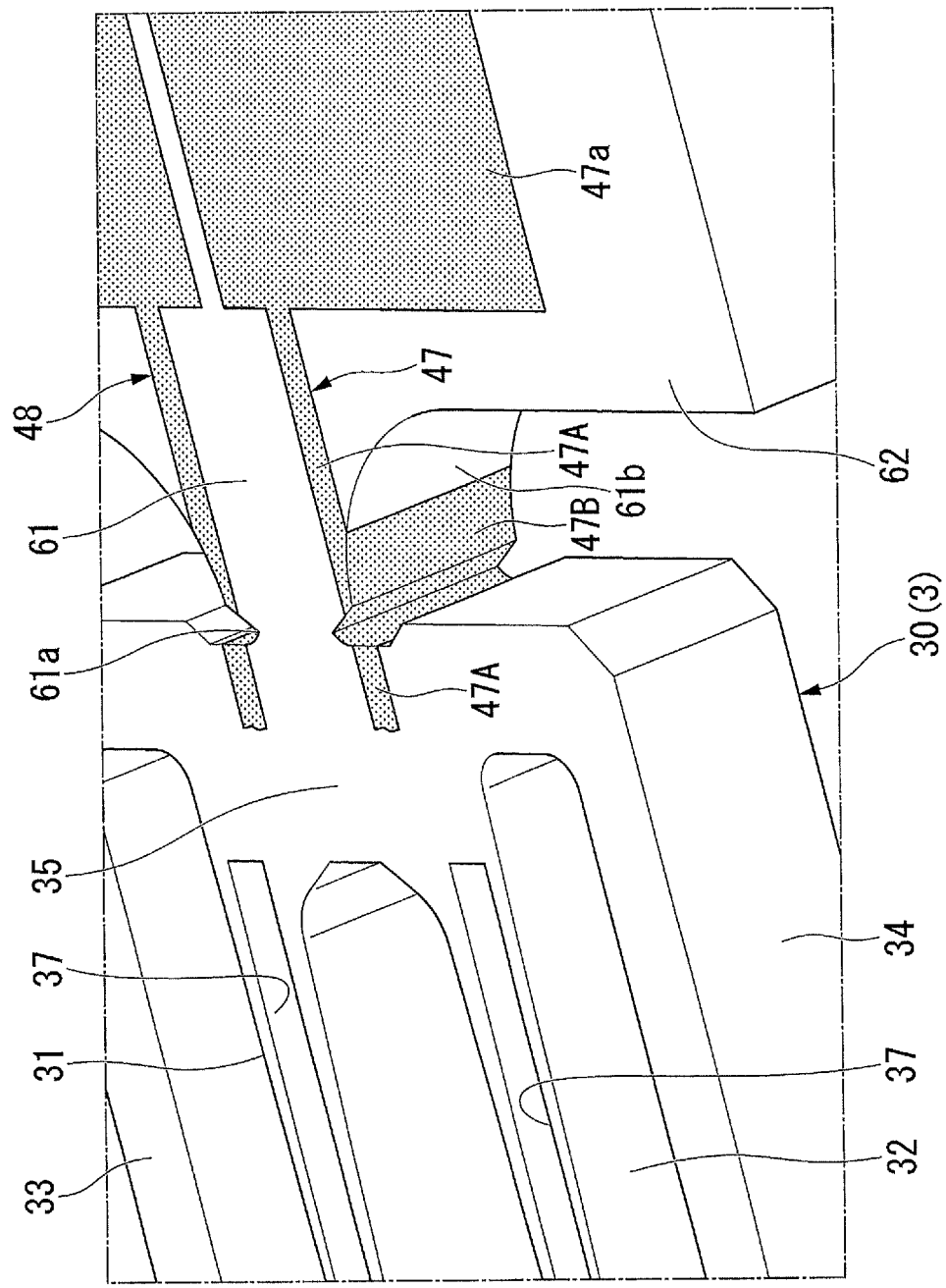
FIG. 9 is a process chart for explaining the method of manufacturing the piezoelectric vibrator element according to the embodiment, and is a perspective view of a connection part of the wafer viewed from a second support arm part side.

FIG. 6 is a flowchart showing a method of manufacturing the piezoelectric vibrator element according to the embodiment. FIG. 7 through FIG. 9 are process charts for explaining the method of manufacturing the piezoelectric vibrator element according to the embodiment, wherein FIG. 7 and FIG. 8 are partial plan views of a wafer viewed from the one principal surface side, and FIG. 9 is a perspective view of the connection part of the wafer viewed from the second support arm part side. It should be noted that in FIG. 8 and FIG. 9, the excitation electrodes 41, 42, the mounting electrodes 43, 44, the wiring electrodes 45, 46, and the weight metal film 50 are omitted from the illustration.

As shown in FIG. 6, the method of manufacturing the piezoelectric vibrator element 3 according to the present embodiment has an outline forming process S10, an electrode forming process S20, a weight metal film forming process S30, a frequency adjusting process S40, and a segmentallizing process S50.

(Outline Forming Process)

Firstly, the outline forming process S10 is performed. As shown in FIG. 7, in the outline forming process S10, the plurality of piezoelectric plates 30, and a frame part 62 for supporting the piezoelectric plates 30 via respective connection parts 61 are provided to a wafer 60.

Specifically, a mask (an outline mask) having a shape corresponding to the outline shape of the piezoelectric plates 30, the connection parts 61, and the frame part 62 is formed on the both surfaces of the wafer 60 using a photolithography technology. Subsequently, a wet-etching process is performed on the wafer 60. Thus, the area, which is not masked by the outline mask, is selectively removed to thereby form the outline shape of the plurality of piezoelectric vibrator elements 30, the connection parts 61, and the frame part 62. On this occasion, the piezoelectric plates 30 are in the state of being arranged side by side in the width direction W, and connected to the frame part 62 via the respective connection parts 61. Further, among the outer surfaces of the wafer 60, the end surface (the side surface) formed by wet etching forms a natural crystal surface of the quartz crystal.

Then, the etching process is performed on the vibrating arm parts 31, 32 to form the groove parts 37 on the both principal surfaces of the vibrating arm parts 31, 32.

Here, the connection part 61 connects the frame part 62 and the edge on the opposite side to the vibrating arm parts 31, 32 in the longitudinal direction L of the base part 35 of the piezoelectric plate 30 to each other. The connection part 61 extends along the longitudinal direction L from the frame part 62 toward the base part 35 of the piezoelectric plate 30. The width in the width direction W of the connection part 61 gradually decreases in a direction from the frame part 62 toward the base part 35 of the piezoelectric plate 30. A boundary part 61a (a narrow part) between the connection part 61 and the piezoelectric plate 30 is disposed in a central part in the width direction W of the edge of the base part 35. The boundary part 61a is made to have the smallest width in the width direction W of the connection part 61. The width dimension of the boundary part 61a is set to, for example, approximately 30 through 50 μm.

(Electrode Forming Process)

Subsequently, the electrode forming process S20 is performed. In the electrode forming process S20, an electrode film is patterned on the wafer 60 to provide each of the piezoelectric plates 30 with the excitation electrodes 41, 42, the mounting electrodes 43, 44, and the wiring electrodes 45, 46, and at the same time form the extending electrodes 47, 48 extending from each of the piezoelectric plates 30 to the frame part 62 through the corresponding one of the connection parts 61.

Specifically, the electrode film is deposited on the principal surface and the side surface of the wafer 60 using the sputtering method, the evaporation method, or the like. The electrode film is formed of a laminated film, which has a single layer film made of metal such as gold or metal such as chromium as a foundation layer, and metal such as gold as an upper layer, or the like.

Subsequently, a mask (an electrode mask) made of a resist material having a shape corresponding to the outline shape of the electrodes 41 through 48 is formed on the surface of the electrode film using the photolithography technology.

Then, an etching process is performed on the electrode film to selectively remove the electrode film in the areas not masked by the electrode mask. Thus, the excitation electrodes 41, 42, the mounting electrodes 43, 44, and the wiring electrodes 45, 46 are provided to each of the piezoelectric plates 30. Further, as shown in FIG. 8 and FIG. 9, the extending electrodes 47, 48 are formed in an area extending from the piezoelectric plate 30 to the frame part 62 through the connection part 61.

As shown in FIG. 8, the first extending electrode 47 includes an on-principal surface formation part 47A disposed on the one principal surface of the wafer 60, and an on-side surface formation part 47B disposed on the side surface of the base part 35 and on a side surface 61b of the connection part 61. The on-principal surface formation part 47A extends along the longitudinal direction L, and at the same time is divided on the second support arm part 34 side in the width direction W of the boundary part 61a into a part formed on the base part 35 and a part formed on the connection part 61 and the frame part 62. The part formed on the base part 35 out of the on-principal surface formation part 47A is connected to the first wiring electrode 45 in one end part on the vibrating arm parts 31, 32 side, and is connected to the on-side surface formation part 47B in the other end part. The part formed on the connection part 61 and the frame part 62 out of the on-principal surface formation part 47A is connected to the on-side surface formation part 47B in one end part on the vibrating arm parts 31, 32 side, and is connected to a first pad part 47a having a rectangular shape disposed on the one principal surface of the frame part 62 in the other end part. As shown in FIG. 8 and FIG. 9, the on-side surface formation part 47B is formed in an area extending from the side surface of the base part 35 to the side surface 61b of the connection part 61 through the side surface of the boundary part 61a on the second support arm part 34 side of the central axis O (see FIG. 5) in the width direction W.

As shown in FIG. 8, the second extending electrode 48 is disposed in the state of being isolated from the first extending electrode 47. The second extending electrode 48 includes an on-principal surface formation part 48A disposed on the one principal surface of the wafer 60, and an on-side surface formation part 48B disposed on the side surface of the base part 35 and on the side surface 61b of the connection part 61. The on-principal surface formation part 48A extends along the longitudinal direction L, and at the same time is divided on the first support arm part 33 side in the width direction W of the boundary part 61a into a part formed on the base part 35 and a part formed on the connection part 61 and the frame part 62. The part formed on the base part 35 out of the on-principal surface formation part 48A is connected to the second wiring electrode 46 in one end part on the vibrating arm parts 31, 32 side, and is connected to the on-side surface formation part 48B in the other end part. The part formed on the connection part 61 and the frame part 62 out of the on-principal surface formation part 48A is connected to the on-side surface formation part 48B in one end part on the vibrating arm parts 31, 32 side, and is connected to a second pad part 48a having a rectangular shape disposed on the one principal surface of the frame part 62 in the other end part. The on-side surface formation part 48B is formed in an area extending from the side surface of the base part 35 to the side surface 61b of the connection part 61 through the side surface of the boundary part 61a on the first support arm part 33 side of the central axis O (see FIG. 5) in the width direction W.

As shown in FIG. 8, the pad parts 47a, 48a are disposed corresponding to each of the piezoelectric plates 30, and are disposed so as to be arranged side by side alternately in the width direction W. It should be noted that the positions of the pad parts 47a, 48a are not particularly limited, but the pad parts 47a, 48a can be disposed at positions overlapping the piezoelectric plate 30 in the width direction W, or can also be disposed at positions corresponding to an intermediate area between the piezoelectric plates 30 adjacent in the width direction W to each other.

(Weight Metal Film Forming Process)

Subsequently, the weight metal film forming process S30 is performed. In the weight metal film forming process S30, the weight metal films 50 used for the frequency adjustment are formed on the surfaces of the weight parts 31B, 32B in the vibrating arm parts 31, 32. The weight metal films 50 can be formed using, for example, evaporation. It should be noted that the weight metal films 50 can also be formed at the same time as the electrodes 41 through 48 in the electrode forming process S20.

(Frequency Adjusting Process)

Subsequently, the frequency adjusting process S40 is performed. In the frequency adjusting process S40, a predetermined drive voltage is applied between the extending electrodes 47, 48 to vibrate the vibrating arm parts 31, 32 of the piezoelectric plate 30 to thereby adjust the frequency of the piezoelectric vibrator element 3 (the piezoelectric plate 30).

Specifically, probes or the like of a measurement instrument for applying the drive voltage are pressed against the pad parts 47a, 48a on the frame part 62. In this state, the predetermined drive voltage is applied between the excitation electrodes 41, 42 via the extending electrodes 47, 48 to vibrate the vibrating arm parts 31, 32. The weight metal films 50 on the respective vibrating arm parts 31, 32 are partially removed in accordance with a difference between the frequency measured on this occasion and a predetermined target frequency of the piezoelectric vibrator element 3. Thus, since the mass of each of the vibrating arms 31, 32 changes, the frequency (the frequency of the piezoelectric vibrator element 3) of the vibration of the vibrating arm parts 31, 32 changes. Therefore, the frequency of the piezoelectric vibrator element 3 can be approximated to the target frequency.

(Segmentallizing Process)

Subsequently, the segmentallizing process S50 is performed. In the segmentallizing process S50, the connection parts 61 are cut to segmentallize the piezoelectric plates 30.

Specifically, the connection parts 61 are cut in such a manner as to bend the piezoelectric plates 30 with respect to the frame part 62. On this occasion, since the width of the connection part 61 is the narrowest at the boundary part 61a, the connection part 61 is cut at the boundary part 61a.

Due to the processes described hereinabove, the plurality of piezoelectric vibrator elements 3 can be manufactured in a lump from the single wafer 60.

As described above, according to the method of manufacturing the piezoelectric vibrator element 3 related to the present embodiment, since the extending electrodes 47, 48 are formed on the side surface 61b of the connecting part 61, it is possible to prevent the pair of extending electrodes 47, 48 from being formed at positions adjacent to each other on the principal surface of the connection part 61. Thus, it is possible to form the connection part 61 with narrower width compared to the related art of forming the pair of extending electrodes on one principal surface of the connection part while preventing the pair of extending electrodes 47, 48 from shorting. Therefore, it becomes possible to easily cut the connection parts 61, and it is possible to prevent the piezoelectric vibrator element 3 from being damaged when segmentallizing the piezoelectric vibrator element 3.

Further, since the pair of extending electrodes 47, 48 are formed on the side surface of the boundary part 61a having the smallest width of the connection part 61, the pair of extending electrodes 47, 48 can more surely be prevented from being formed at the positions adjacent to each other. Thus, it is possible to form the connection part 61 with narrower width compared to the related art while preventing the pair of extending electrodes 47, 48 from shorting. Therefore, it becomes possible to more easily cut the connection parts 61, and it is possible to prevent the piezoelectric vibrator element 3 from being damaged when segmentallizing the piezoelectric vibrator element 3.

It should be noted that although in the present embodiment described above, both of the pair of extending electrodes 47, 48 are formed on the side surface 61b of the connection part 61, this is not a limitation.

Figure 10:
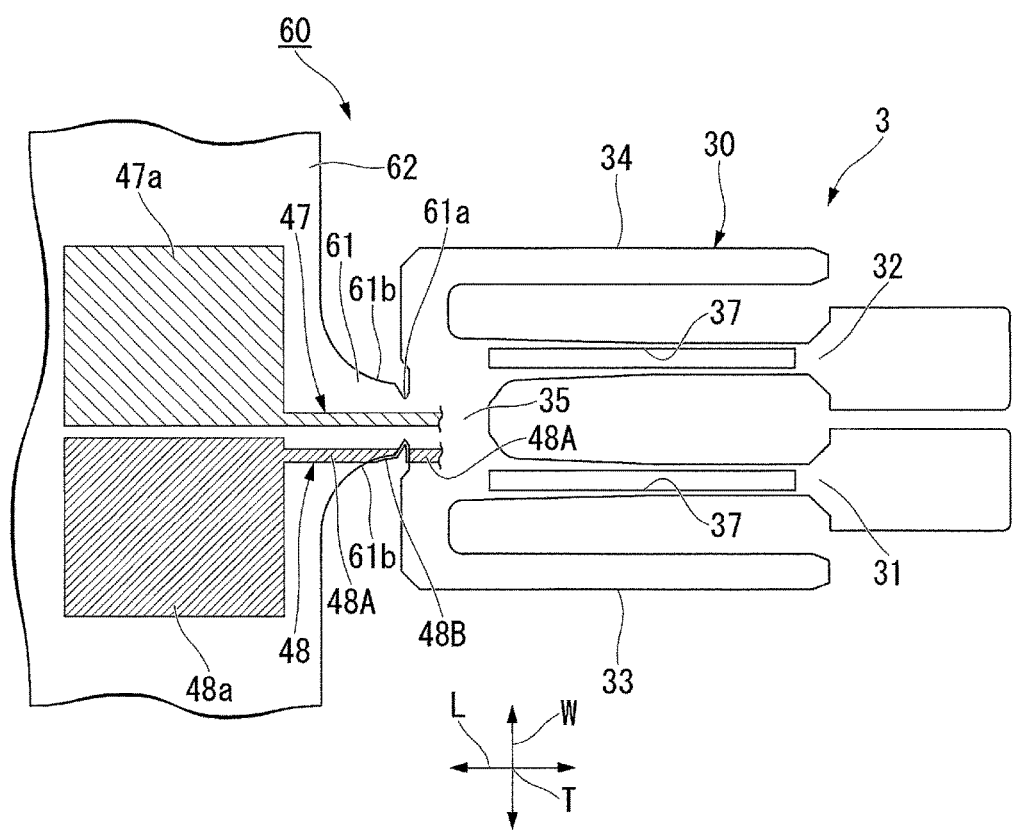
FIG. 10 is a process chart for explaining a method of manufacturing a piezoelectric vibrator element according to a first modified example of the embodiment, and is a partial plan view of a wafer viewed from one principal surface side.

FIG. 10 is a process chart for explaining a method of manufacturing a piezoelectric vibrator element according to a first modified example of the embodiment, and is a partial plan view of a wafer viewed from one principal surface side.

As shown in FIG. 10, it is also possible to form only either one of the extending electrodes 47, 48 (the first extending electrode 47 in the example shown in the drawing) on the one principal surface of the wafer 60, and to form the other (the second extending electrode 48 in the example shown in the drawing) on the side surface 61b of the connection part 61.

Further, if the wet-etching process is performed on the quartz crystal in the outline forming process, an irregularly-shaped part formed of the natural crystal surface of the piezoelectric material is formed on the side surface 61b of the connection part 61 as the etching residue in some cases. The case in which the irregularly-shaped part is formed on the side surface 61b of the connection part 61 will hereinafter be described.

Figure 11:
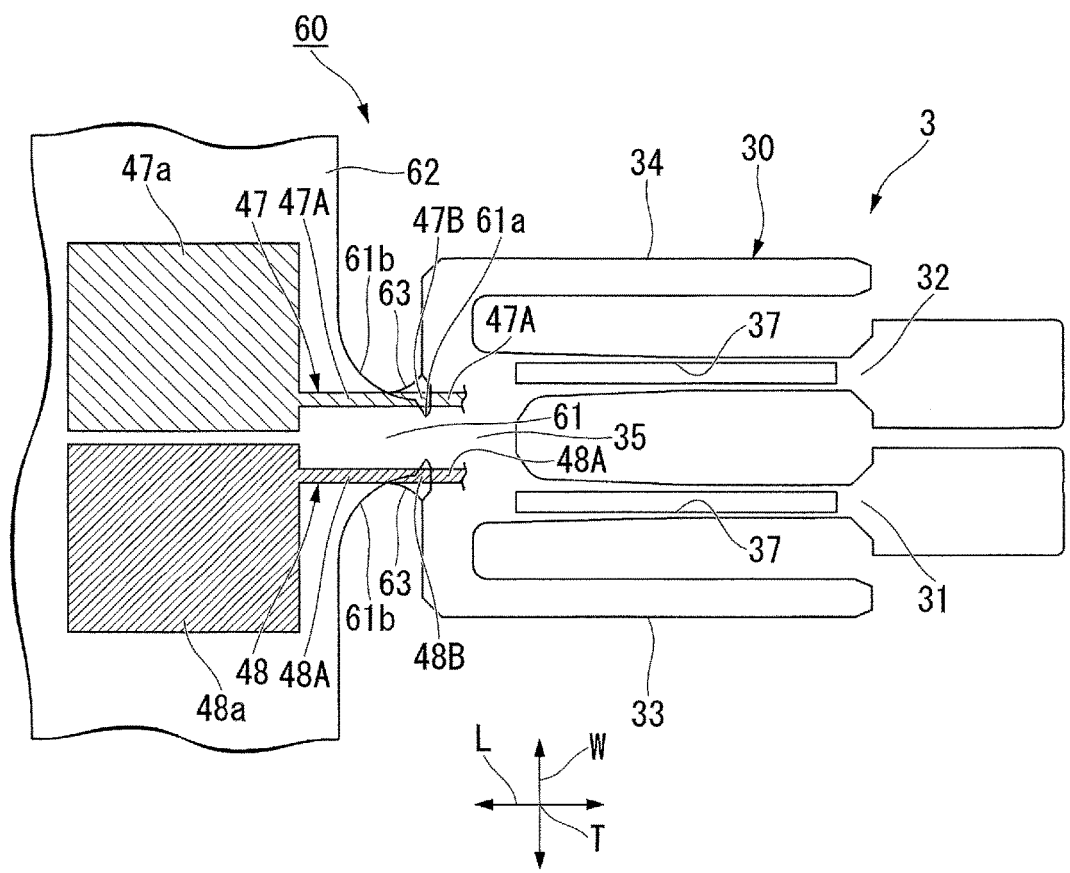
FIG. 11 is a process chart for explaining a method of manufacturing a piezoelectric vibrator element according to a second modified example of the embodiment, and is a partial plan view of a wafer viewed from one principal surface side.
Figure 12:
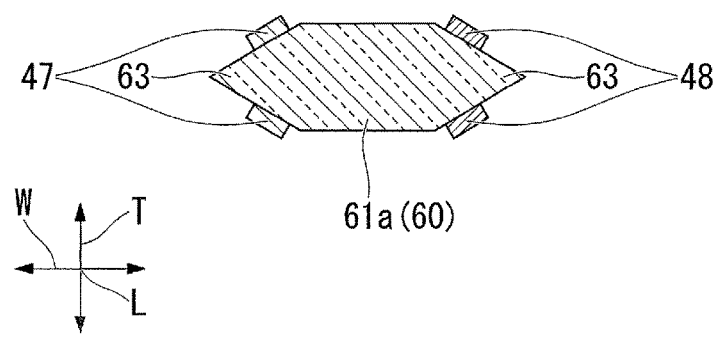
FIG. 12 is a cross-sectional view of a connection part of the wafer shown in FIG. 11 viewed from a longitudinal direction.

FIG. 11 is a process chart for explaining a method of manufacturing a piezoelectric vibrator element according to a second modified example of the embodiment, and is a partial plan view of a wafer viewed from one principal surface side. FIG. 12 is a cross-sectional view of the connection part of the wafer shown in FIG. 11 viewed from a longitudinal direction.

For example, in the example shown in FIG. 11 and FIG. 12, irregularly-shaped parts 63 are formed on two corner parts on the both sides in the width direction W in the boundary part 61a between the connection part 61 and the base part 35 of the piezoelectric plate 30. The surface of the irregularly-shaped part 63 is a surface tilted with respect to the principal surface of the wafer 60. In this case, the extending electrodes 47, 48 are formed on the irregularly-shaped parts 63 in the electrode forming process S20. Thus, it is possible to prevent the pair of extending electrodes 47, 48 from being formed at positions adjacent to each other on the principal surface of the connection part 61. Therefore, it is possible to form the connection part 61 with narrower width compared to the related art while preventing the pair of extending electrodes 47, 48 from shorting. Therefore, it becomes possible to easily cut the connection parts 61, and it is possible to prevent the piezoelectric vibrator element 3 from being damaged when segmentallizing the piezoelectric vibrator element 3.

Figure 13:
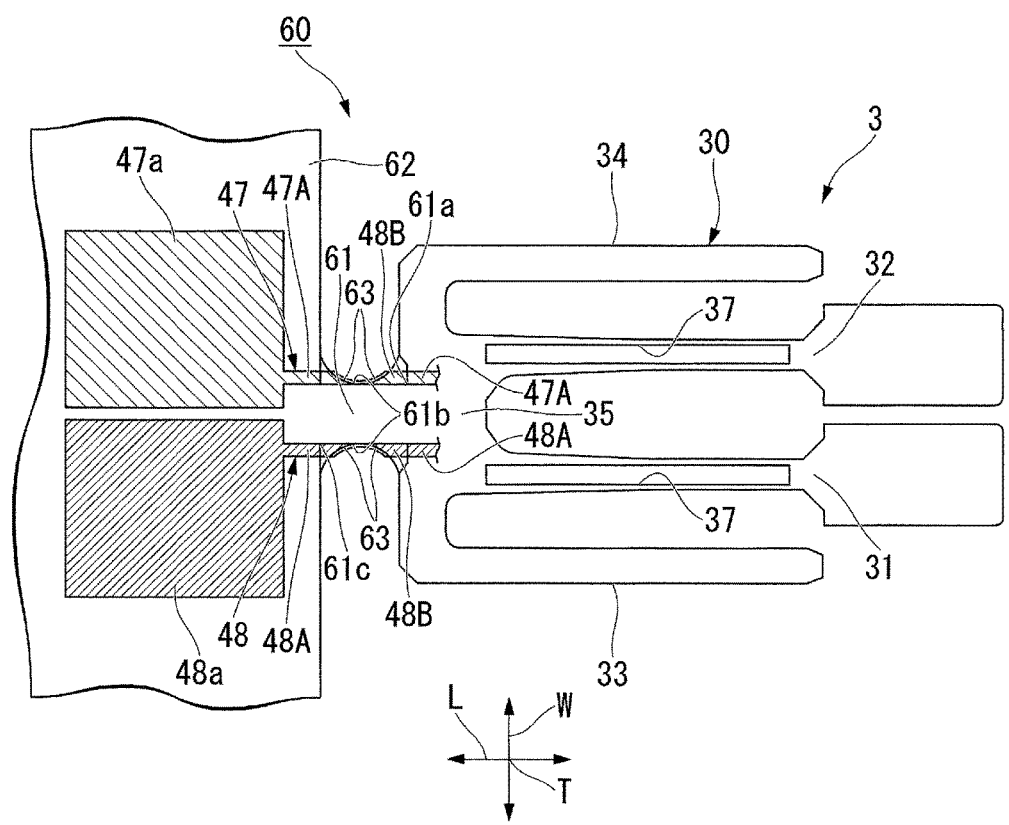
FIG. 13 is a process chart for explaining a method of manufacturing a piezoelectric vibrator element according to a third modified example of the embodiment, and is a partial plan view of a wafer viewed from one principal surface side.

FIG. 13 is a process chart for explaining a method of manufacturing a piezoelectric vibrator element according to a third modified example of the embodiment, and is a partial plan view of a wafer viewed from one principal surface side.

Further, in the example shown in FIG. 13, the connection part 61 extends along the longitudinal direction L from the frame part 62 toward the base part 35 of the piezoelectric plate 30 so as to have a constant width. The irregularly-shaped parts 63 are formed at two corner parts on the both sides in the width direction W in the boundary part 61a between the connection part 61 and the base part 35, and two corner parts on the both sides in the width direction W in a boundary part 61c between the connection part 61 and the frame part 62. Even in this case, by forming the extending electrodes 47, 48 in the irregularly-shaped parts 63 in the electrode forming process S20, the pair of extending electrodes 47, 48 can be prevented from being formed at positions adjacent to each other on the principal surface of the connection part 61 similarly to the second modified example. Therefore, it is possible to form the connection part 61 with narrower width compared to the related art while preventing the pair of extending electrodes 47, 48 from shorting. Therefore, it becomes possible to easily cut the connection parts 61, and it is possible to prevent the piezoelectric vibrator element 3 from being damaged when segmentallizing the piezoelectric vibrator element 3.

It should be noted that the invention is not limited to the above embodiment described with reference to the drawings, but a variety of modified examples can be cited within the scope or the spirit of the invention.

For example, in the example described above, the piezoelectric vibrator element 3 is a so-called side-arm vibrator element having the support arm parts 33, 34 disposed on the outer side of the vibrating arms 31, 32. However, this configuration is not a limitation, but the piezoelectric vibrator element can also be, for example, a so-called center-arm vibrator element having a single support arm part disposed between the pair of vibrating arm parts, or a vibrator element not provided with any support arm part. Further, it is also possible to adopt the configuration in which the vibrating arm parts are not provided with the groove part.

Further, although in the embodiment described above, the first electrodes 47 formed so as to correspond respectively to the piezoelectric plates 30 are patterned in the state of being electrically isolated from each other, and the second electrodes 48 formed so as to correspond respectively to the piezoelectric plates 30 are patterned in the state of being electrically isolated from each other on the frame part 62, this configuration is not a limitation. On the frame part 62, the first extending electrodes or the second extending electrodes formed so as to correspond respectively to the piezoelectric plates 30 can electrically be connected to each other. Thus, it is possible to keep the probes of the measurement instrument to be pressed against one of the extending electrodes electrically connected to each other at the predetermined positions set in advance when separately measuring the frequencies of the plurality of piezoelectric vibrator elements 3 in the frequency adjusting process. Therefore, when measuring the frequencies of the plurality of piezoelectric vibrator elements 3 separately from each other, it is possible to prevent cumbersome and complicated trouble, and it becomes possible to perform the measurement of the frequency with efficiency compared to the case of moving the pair of probes every time the measurement is performed.

Besides the above, it is arbitrarily possible to replace the constituent in the embodiment described above with a known constituent within the scope or the spirit of the invention.

What is claimed is:

1. A method of manufacturing a piezoelectric vibrator element using a wafer made of a piezoelectric material, the piezoelectric vibrator element including a piezoelectric plate, and a pair of excitation electrodes on the piezoelectric plate and adapted to vibrate the piezoelectric plate when a predetermined drive voltage is applied, the method comprising:
   providing the wafer with the piezoelectric plate and a frame part adapted to support the piezoelectric plate via a connection part;
   providing the pair of excitation electrodes on the piezoelectric plate by patterning an electrode film on a principal surface and a side surface of the wafer, and forming a pair of extending electrodes extending from the piezoelectric plate to the frame part through the connection part to electrically connect to the pair of excitation electrodes; and
   segmentallizing the piezoelectric plate by cutting the connection part,
   wherein providing the pair of excitation electrodes includes forming at least one of the pair of extending electrodes on a side surface of the connection part.

2. The method of manufacturing a piezoelectric vibrator element according to claim 1, wherein providing the wafer includes forming an irregularly-shaped part having a surface tilted with respect to a principal surface of the wafer on the side surface of the connection part, and
   providing the pair of excitation electrodes includes forming at least one of the pair of extending electrodes on the irregularly-shaped part.

3. The method of manufacturing a piezoelectric vibrator element according to claim 1, wherein providing the wafer includes forming the connection part so that a width of the connection part decreases in a direction from the frame part toward the piezoelectric plate, and
   providing the pair of excitation electrodes includes forming at least one of the pair of extending electrodes on a side surface of a narrow part having a smallest width of the connection part.

* * * * *